US007638746B2

(12) United States Patent
Jespersen

(10) Patent No.: US 7,638,746 B2
(45) Date of Patent: Dec. 29, 2009

(54) SENSING SYSTEM FOR DETECTING WHETHER ONE BILL, OR MORE THAN ONE BILL, IS PRESENT AT A SENSING STATION IN AN ATM

(75) Inventor: Gunnar Jespersen, Aberdeen (GB)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 11/016,661

(22) Filed: Dec. 17, 2004
(Under 37 CFR 1.47)

(65) Prior Publication Data

US 2005/0173659 A1 Aug. 11, 2005

(30) Foreign Application Priority Data

Dec. 20, 2003 (GB) ................................ 0329595.3

(51) Int. Cl.
*H01L 27/00* (2006.01)
*G02B 6/06* (2006.01)

(52) U.S. Cl. ................................ 250/208.1; 250/227.2

(58) Field of Classification Search ............ 250/559.36, 250/559.4, 208.1, 221, 216, 559.27, 559.19, 250/559.01, 559.04, 559.05, 559.07, 559.08, 250/227.11, 227.2; 356/429, 71, 625–640; 399/370; 382/135

See application file for complete search history.

(56) References Cited

U.S. PATENT DOCUMENTS

| | | | | | |
|---|---|---|---|---|---|
| 3,771,873 | A | * | 11/1973 | Tourret | 356/4.07 |
| 4,525,630 | A | * | 6/1985 | Chapman | 250/559.4 |
| 4,542,829 | A | * | 9/1985 | Emery et al. | 209/534 |
| 4,559,451 | A | * | 12/1985 | Curl | 250/559.36 |
| 5,034,616 | A | * | 7/1991 | Bercovitz | 250/556 |
| 5,086,220 | A | | 2/1992 | Berthold et al. | |
| 5,389,789 | A | * | 2/1995 | Nguyen | 250/341.1 |
| 5,534,690 | A | * | 7/1996 | Goldenberg et al. | 250/222.1 |
| 5,576,825 | A | * | 11/1996 | Nakajima et al. | 356/71 |
| 5,585,645 | A | * | 12/1996 | Goto | 250/559.12 |
| 5,699,448 | A | * | 12/1997 | Gorenflo et al. | 382/151 |
| 5,828,724 | A | | 10/1998 | Kurtz | |
| 6,172,745 | B1 | * | 1/2001 | Voser et al. | 356/71 |

FOREIGN PATENT DOCUMENTS

| | | | |
|---|---|---|---|
| EP | 0 936 144 | A1 | 8/1999 |
| FR | 2.218.599 | A | 9/1974 |
| FR | 2 218 599 | A | 9/1974 |
| GB | 2 228 817 | A | 9/1990 |
| GB | 2 351 555 | A | 1/2001 |
| GB | 2 351 556 | A | 1/2001 |
| JP | 8315143 | A | 11/1996 |

* cited by examiner

*Primary Examiner*—Que T Le
*Assistant Examiner*—Pascal M Bui-Pho
(74) *Attorney, Agent, or Firm*—Gregory A. Welte

(57) ABSTRACT

A sensing arrangement (11) for sensing objects at a plurality of sensing sites (64) is described herein. In one embodiment the arrangement comprises: an imaging device (60) having an array of light-detecting elements; a light guide arrangement (62) extending from the sensing sites (64) to the imaging device (60); a mount (79) for maintaining the light guide arrangement (62) and the imaging device (60) in a fixed spatial relation so that each sensing site (64) illuminates a zone (**60*a,b*) of different elements on the array; and a processor (72), in communication with the imaging device (60**), for analyzing image data captured by each zone. A method of sensing an object is also described herein.

17 Claims, 6 Drawing Sheets

FIG. 2A
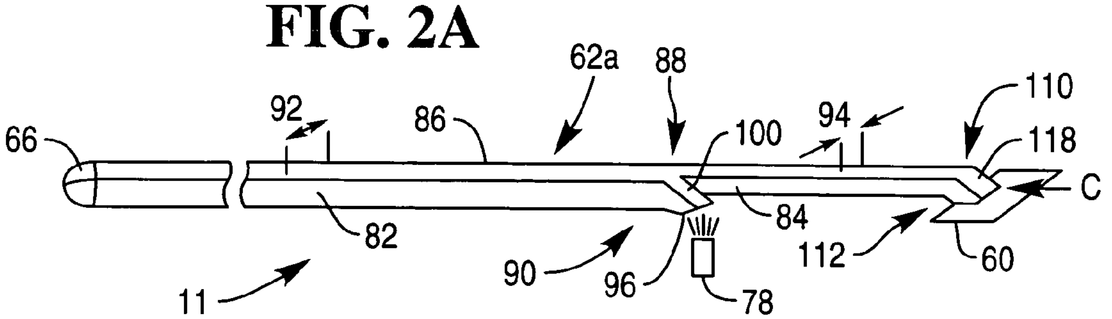
FIG. 2B
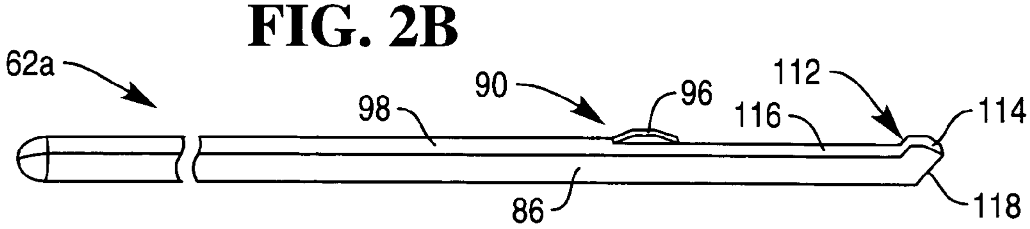
FIG. 2C
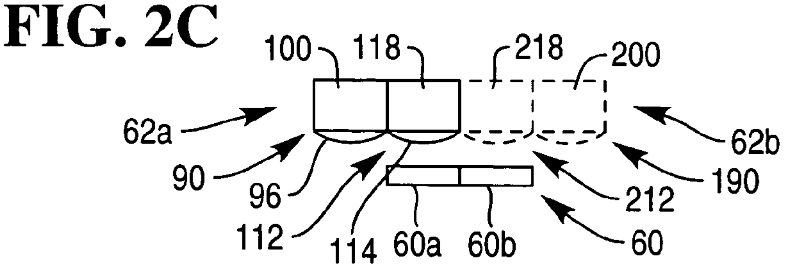
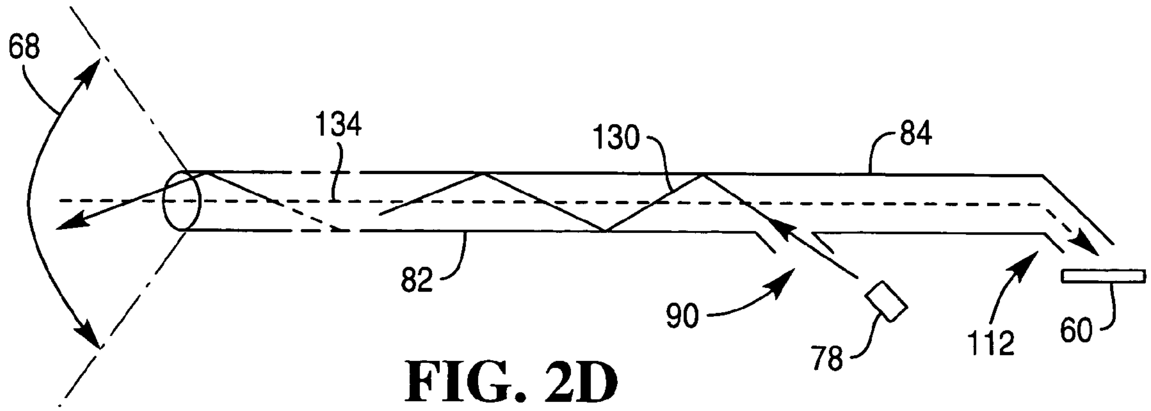
FIG. 2D

FIG. 3A
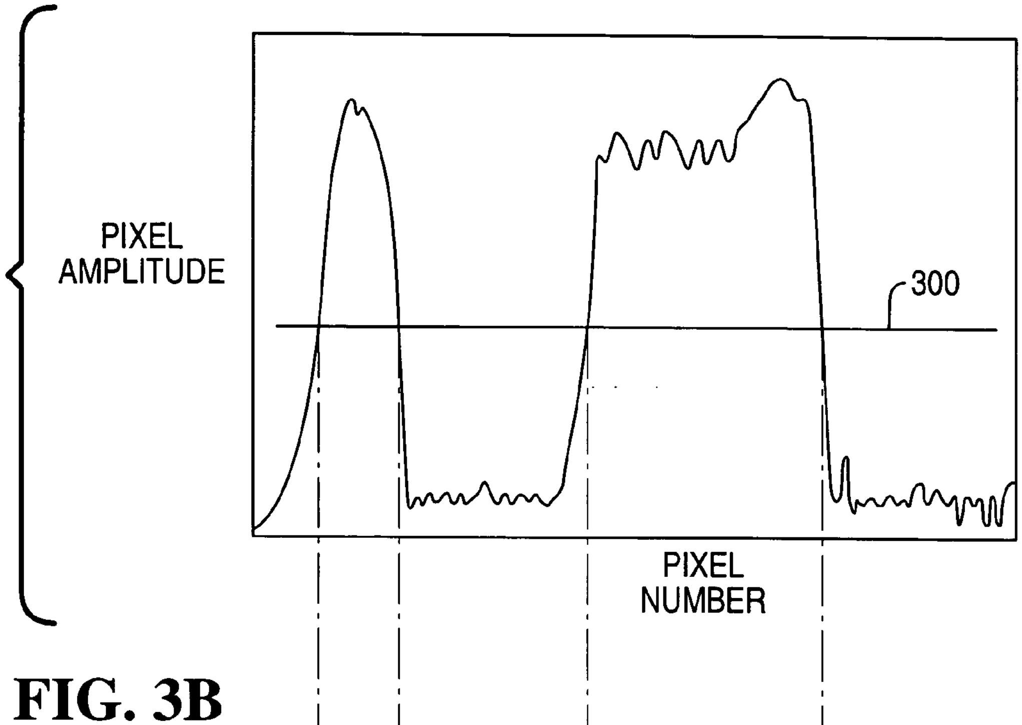
FIG. 3B
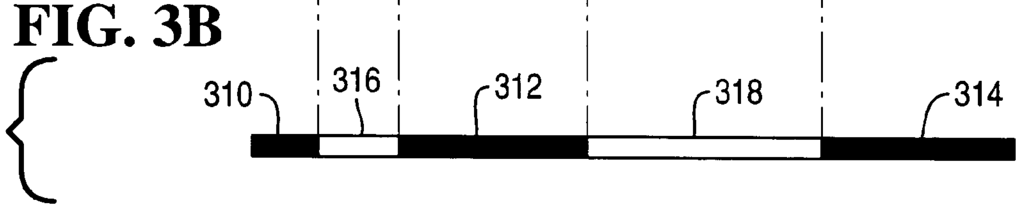
FIG. 4A
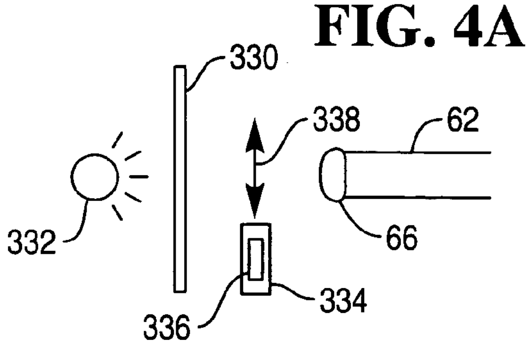
FIG. 4C
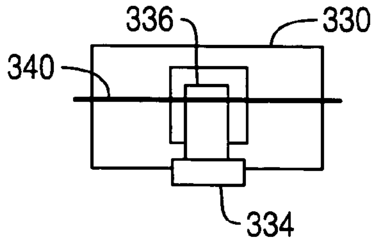
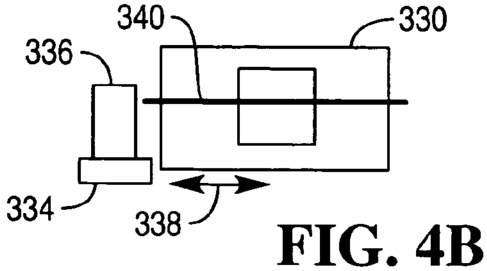
FIG. 4B FIG. 5A
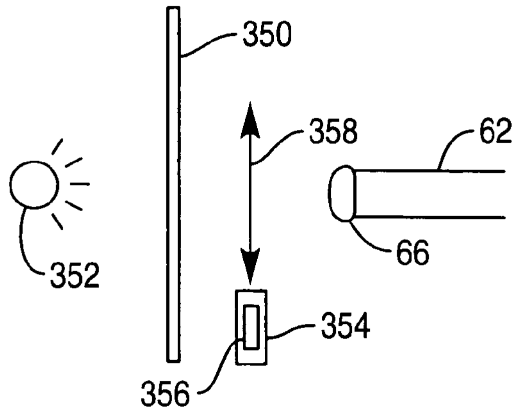
FIG. 5C
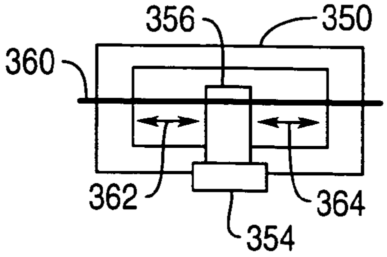
FIG. 5B
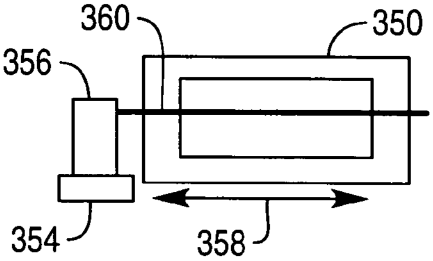
FIG.6A
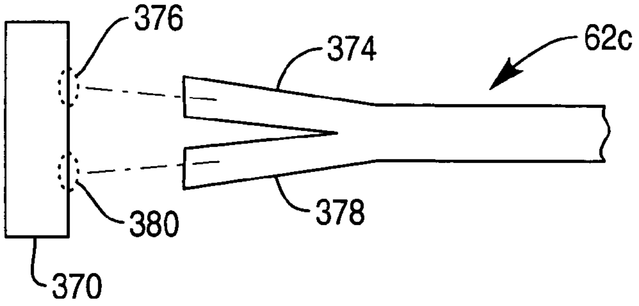
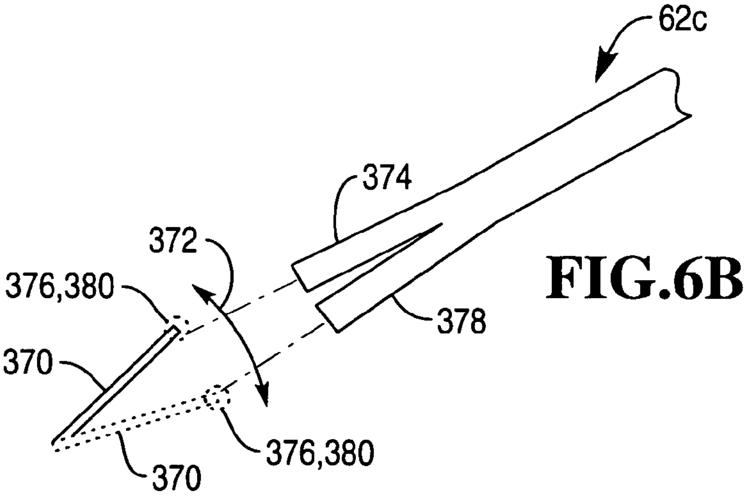
FIG.6B FIG. 7A
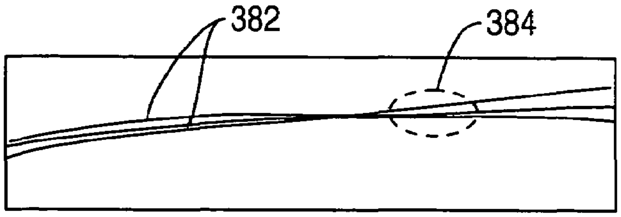
FIG. 7B
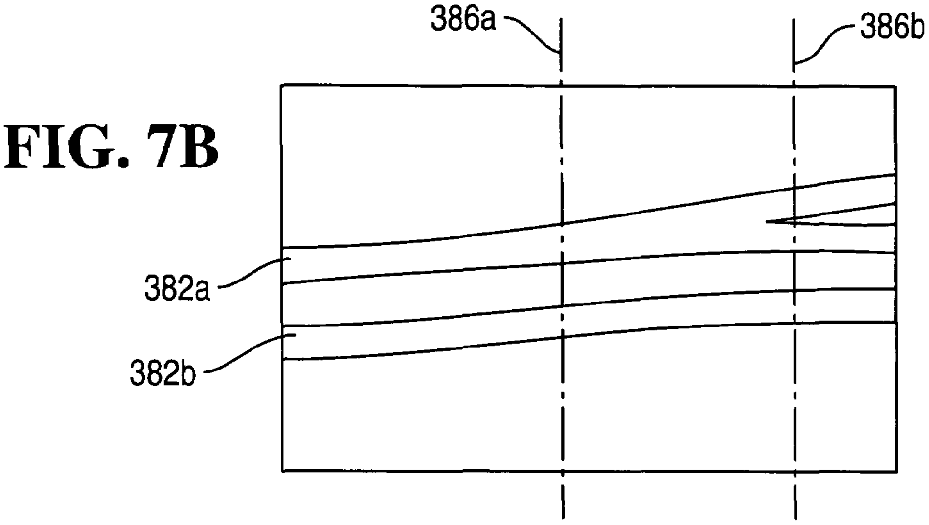
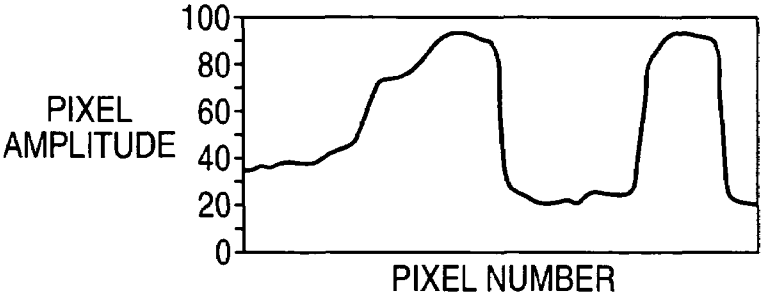
FIG. 7C
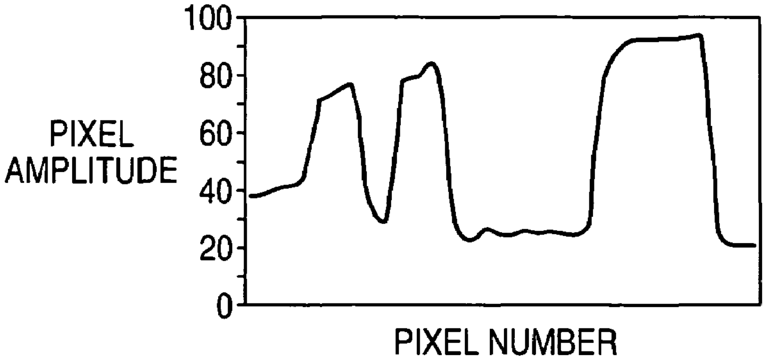
FIG. 7D

SENSING SYSTEM FOR DETECTING WHETHER ONE BILL, OR MORE THAN ONE BILL, IS PRESENT AT A SENSING STATION IN AN ATM

BACKGROUND OF THE INVENTION

The present invention relates to a sensing arrangement, and to a media handling device incorporating a sensing arrangement. In particular, the invention relates to a sensing arrangement incorporated in a media dispenser for extracting media items from a media container installed in the media dispenser. The invention also relates to a self-service terminal, such as an automated teller machine (ATM), including a media dispenser.

Media handlers are well known in self-service terminals such as ticket dispensers, photocopiers, ATMs, and such like. In an ATM, a media handler may be a banknote or check depository, a currency recycler, or a currency dispenser.

A conventional currency dispenser has a presenter module located above one or more pick modules. Each pick module houses a banknote container, such as a currency cassette or a hopper, holding the banknotes to be dispensed. In operation, a pick module picks individual banknotes from the media container and transports the picked notes to the presenter module. The presenter module includes a multiple note detect station, a purge bin for storing rejected notes, and an exit aperture for presenting non-rejected notes to a user. If the dispenser presents notes to a user in bunch form, then a stacker wheel and a clamping and bunching station are also provided to collate a plurality of individual notes into a bunch.

A currency dispenser typically includes a plurality of sensors within the presenter module and within each pick module for ensuring that the dispenser is operating correctly. These sensors include (i.) moving parts sensors, that is, sensors for monitoring the position of moving parts of the dispenser itself, and (ii.) media sensors, that is, sensors for monitoring banknotes (or other media items) being transported within the dispenser.

The moving parts sensors include: a pick arm sensor, a clamp home sensor, a purge gate open/closed sensor, a timing disc sensor, a presenter timing disc sensor, and an exit shutter open/closed sensor.

The media sensors include: a pick sensor, a multiple note detector station, a sensor for detecting proximity to the multiple note detector station, a stack sensor, a purge transport sensor, an exit sensor near the exit aperture, and one or more transport sensors near the exit sensor.

These sensors are essential for ensuring reliable operation of the dispenser. They allow the dispenser to determine if a note is jammed within the dispenser or if a part of the dispenser is not operating correctly.

One disadvantage of this sensing arrangement is the cost of the sensors and the complexity in manufacturing the dispenser. Another disadvantage of this sensing arrangement is that it has limited ability to predict a fault or jam. Yet another disadvantage of this sensing arrangement is that readings can only be taken at pre-defined fixed points. A further disadvantage of this sensing arrangement is that a complex wiring loom is required to route the sensor wires through the dispenser.

SUMMARY OF THE INVENTION

It is among the objects of an embodiment of the present invention to obviate or mitigate one or more of the above disadvantages, or other disadvantages associated with prior art sensing arrangements and/or media handling devices.

According to a first aspect of the present invention there is provided a sensing arrangement for sensing objects at a plurality of sensing sites, the arrangement comprising:

- an imaging device having an array of light-detecting elements;
- a light guide arrangement extending from the sensing sites to the imaging device;
- a mount for maintaining the light guide arrangement and the imaging device in a fixed spatial relation so that each sensing site illuminates a zone of different elements on the array; and
- a processor, in communication with the imaging device, for analyzing image data captured by each zone.

A sensing site is a position from which the light guide arrangement can view a sensing area in which objects to be detected are located. This enables expected positions of an object to be mapped to a group of elements on the array so that this group of elements can be analyzed to determine the position of the object.

Preferably, the sensing arrangement further comprises a light source for illuminating the sensing area. The light source may be a white light LED, although any other convenient light source may be used.

Preferably, the light source is controlled by the processor, thereby enabling the intensity of illumination to be adjusted to provide the correct illumination for the object or objects being detected.

Preferably, the light guide arrangement comprises a plurality of light guides, each light guide extending from a different zone of the imaging device to a sensing site. In some embodiments, the light guide arrangement may comprise a single light guide.

Preferably, the light source is located in the vicinity of the imaging device and irradiates sensing areas by transmission through the light guide arrangement. Such a light source may be referred to herein as a "light guide light source".

In embodiments where the light guide arrangement comprises a plurality of light guides, a single light source may be used to illuminate all of the light guides. Alternatively, each light guide may have a dedicated light source, or a plurality of light guides (but less than all of the light guides) may share a light source.

In some embodiments, illumination may be provided in the vicinity of the sensing site from a light source that does not transmit light through the light guide. This illumination may be provided to increase the ambient light at a sensing site, or to increase the contrast between a marker at a sensing site and features in the vicinity of the marker. Such a light source may be referred to herein as a "sensing site light source".

A marker portion having predetermined properties (such as size, shape, color, transmissivity, and such like) may be provided as part of an object to be detected to facilitate detection of the object. The marker portion may be referred to herein as a semaphore.

Each light guide light source may include a focusing lens for collimating light from the source into one or more light guides. The focusing lens may be integral with the light source.

Preferably, each light guide includes a reflective lens arrangement (which may be a single lens or a combination of lenses) at an end of the guide in the vicinity of the sensing site for focusing reflected light from the sensing area covered by the sensing site towards the imaging device. The reflective lens arrangement may be integral with the light guide.

Preferably, each light guide also includes a collecting lens arrangement (which may be a single lens or a combination of lenses) at an end of the guide in the vicinity of the imaging device for focusing emitted light from the light source towards the sensing site. The collecting lens arrangement may be integral with the light guide.

It should be appreciated that the light guide provides an optical path for an image to be transmitted from a sensing site to the imaging device. Thus, the light guide is not merely an optical fiber but a focusing device providing a fixed optical path to reproduce at the imaging device an image received at a light guide entrance. Of course, if future technological advances provide flexible light pipes that can reproduce an image entering the pipe at an exit of the pipe, then such pipes would be suitable for use with this invention.

The term "light guide" is intended to include a light pipe, a light duct, or such like, that receives an image at an entrance of the guide and accurately reproduces the image at an exit of the guide. A light guide may employ one or more mirrors, prisms, and/or similar optical elements to reproduce an image at the sensor.

A light duct may be a tube having anti-reflecting sidewalls, and some reflecting elements, such as prisms or mirrors, to direct an image through the duct and onto an image sensor. Light ducts may be preferable where the distance between an area under observation and the image sensor is relatively large (for example, more than 10 cm) or where very high resolution is required.

Preferably, the processor has associated firmware for enabling the processor to detect the presence or absence of an object being sensed by analyzing data captured by the imaging device. The object being sensed may be a media item or it may be part of a media handling device in which the sensing arrangement is incorporated. The firmware may also control operation of the media handling device, for example, by controlling a pick arm, transport belts, and such like.

Preferably, the firmware includes a programmable threshold for each zone of light-detecting elements, where a zone of light-detecting elements comprises those elements associated with, and sensitive to light emanating from, a particular light guide. The threshold indicates a limit of light intensity associated with no object being present, such that a light intensity beyond this limit is indicative of an object being present. A light intensity beyond this limit may be greater or smaller than the threshold, for example, depending on whether the light intensity when the object is present is greater or less than the light intensity when the object is not present.

The firmware may include multiple programmable thresholds.

According to a second aspect of the present invention there is provided a media handling device comprising:

a transport for moving media items;

a sensing area covering at least part of the transport;

an imaging device, and a light guide arrangement extending from the sensing area to the imaging device so that the imaging device is able to detect media items on the transport.

Preferably, the media handling device includes a processor and associated firmware for enabling the processor to analyze data captured by the imaging device. The firmware may also control operation of the media handling device. The processor may include associated memory, such as NVRAM or FlashROM.

The media handling device may include a sensing site light source for illuminating the sensing area. No light source may be required in embodiments where an imaging device is able to detect objects without additional illumination.

Preferably, the imaging device comprises an array of light-detecting elements. In one embodiment, the imaging device is a CMOS imaging sensor.

Preferably, the imaging device is partitioned into zones, and the light guide arrangement comprises a plurality of light guides arranged so that each light guide is aligned with a different zone. Partitioning the imaging device into zones requires no physical modification of the device, but rather logically assigning a plurality of adjacent elements to a zone. Alternatively, a plurality of light guides may be aligned with the same zone, but the images conveyed by the respective light guides may be recorded sequentially, thereby providing time division multiplexing of the imaging device.

Preferably, each light guide is an acrylic plastic optical waveguide.

Preferably, each light guide includes a lens arrangement for focusing light into the light guide. The lens arrangement may be integral with, or coupled to, the light guide.

Preferably, a light guide is configured at a sensing site to capture the thickness of a media item being transported. For example, the light guide may be aligned with the plane of movement of a transport. This has the advantage that a media thickness sensor (such as a linear variable differential transducer (LVDT)) is not required because the processor can determine the media thickness from data captured by the imaging device, and compare the media thickness with the thickness of a single media item.

In some embodiments, a triangulation system may be used wherein multiple light guides are used to capture image data relating to an upper surface of a media item. Using data from multiple light guides enables the processor to determine the thickness of the media item, and thereby determine whether multiple superimposed media items are present.

In some embodiments, additional light sources may be used, for example, ultra-violet (in the form of a U.V. LED) or infra red (in the form of an I.R. LED) to detect fluorescence or other security markings in a media item or other object being sensed. This has the advantage of enabling the sensing arrangement to be used for detecting counterfeit media items, or other validation tasks.

In some embodiments, a light guide may be used for detecting fraud at a presenter module exit. The light guide may detect the number of media items presented to a user (for example, using triangulation or by viewing the thickness of the bunch of media items) and the number of media items retracted in the event that the user does not remove all the presented media items. This information can be used to determine how many, if any, media items were removed by the user when the bunch was presented to the user. This can be used to counteract a known type of fraud involving a user removing some notes from a presented bunch and alleging that he/she never received any notes.

Where the media handling device is a depository, a light guide may be used to detect a foreign object entering the device to retrieve items previously deposited. This can be achieved by detecting a moving object in a location where there is no known moving object. This can be used to counteract a known type of fraud involving a user "fishing out" some previously deposited items.

In some embodiments, the media handling device further comprises a video output feature for outputting captured video data from the imaging device. The video output feature uses a communication adapter to transmit the video data. The communication adapter may be an Ethernet card, a USB port, an IEEE 1394 port, or a wireless port, such as an 802.11b port, a Bluetooth port, a cellular telephony port, or such like.

The captured video data may be relayed, for example by streaming, to a remote diagnostic centre or to a portable device carried by a service engineer. This video output may enable the remote centre or engineer to diagnose any problems with the media handling device without having to visit the location where the device is housed.

Conventional Web technologies enable this video output to be viewed by any Web browser. Access to this video output may be restricted using a password protected secure login or such like.

The firmware may include fault prediction capabilities. For example, the firmware may detect patterns emerging from a media item being transported, such as the item beginning to skew or fold and the skewing or folding becoming more pronounced as the item continues to be transported.

The firmware may also include fault averting capabilities. For example, if a media item is skewing as it is transported, the firmware may reverse the transport or take other action to correct the skew or to purge the media item.

The media handling device may be incorporated into a self-service terminal such as an ATM, a photocopier, or a ticket kiosk.

According to a third aspect of the present invention there is provided a method of sensing an object, the method comprising:

- receiving, at each of a plurality of sites, optical information indicative of the presence or absence of an object;
- guiding the optical information in image form to an imaging device;
- imaging the guided information; and
- analyzing the imaged information to determine for each site whether an object is present.

Preferably, the method includes the further step of configuring the imaging device so that a portion of the device (a zone) is dedicated to receiving optical information from a pre-determined site.

The step of imaging the guided information may include the step of reading a single row or column of elements. This may be all that is required if the presence or absence of an object is being determined.

It will be appreciated that this method has applications outside media handling devices, for example in complex machinery, industrial plants, vehicles, and many other applications.

By virtue of these aspects of the invention, numerous infrared sensors and the like can be replaced with a single imaging device and a light guide arrangement leading from a sensing area to the imager. In some embodiments, all sensors in a media handling device can be replaced with a central imaging device and one or more light guides. Light guides can include lenses that capture image data from a relatively wide viewing angle. This enables, for example, a single light guide to be used to capture all relevant image data from a presenter module, so that all sensors conventionally used in a presenter module can be replaced with this single light guide. Similarly, a single light guide can be used to capture all relevant image data from a pick module, so that all sensors presently used in a pick module (for example, a pick sensor and a pick arm sensor) can be replaced by the single light guide in the pick module.

Another advantage of using these light guides is that a large area of a media handling device can be surveyed by each light guide, thereby enabling a media item to be tracked as it is transported. By using an imaging device having a relative high resolution (350,000 light-detecting elements in a 5 mm by 5 mm array), and a relatively high capture rate (500 frames per second), an accurate view of a media item can be obtained as the item is transported.

The word "media" is used herein in a generic sense to denote one or more items, documents, or such like having a generally laminar sheet form; in particular, the word "media" when used herein does not necessarily relate exclusively to multiple items or documents. Thus, the word "media" may be used to refer to a single item (rather than using the word "medium") and/or to multiple items. The term "media item" when used herein refers to a single item or to what is assumed to be a single item. The word "object" is used herein in a broader sense than the word "media", and includes non-laminar items, such as parts of a media handler (for example, a pick arm, a purge pin, and a timing disc).

BRIEF DESCRIPTION OF THE DRAWINGS

These and other aspects of the present invention will be apparent from the following specific description, given by way of example, with reference to the accompanying drawings, in which:

FIG. 2A is a perspective view of a part of the dispenser (an imaging device, light source, and light guide) of FIG. 1;

FIG. 2B is a perspective view of the underside of a part of the dispenser (the light guide) shown in FIG. 2A;

FIG. 2C is an end view of the part of the dispenser shown in FIG. 2A;

FIG. 2D is a schematic view of the part of the dispenser shown in FIGS. 2A to 2C;

FIG. 3A is a graph illustrating light intensity detected by a part of the dispenser (a row of pixels of the imaging device) at a moment in time;

FIG. 3B is a schematic diagram illustrating the light output status of the row of pixels shown in FIG. 3A;

FIG. 4A is a schematic plan diagram illustrating a backlit reference template used in sensing a position of a moving object;

FIG. 4B is a schematic elevation diagram illustrating the backlit reference template of FIG. 4A with an object at one side of the template;

FIG. 4C is a schematic elevation diagram illustrating the backlit reference template of FIG. 4A with an object in front of the template;

FIG. 5A is a schematic plan diagram illustrating a backlit extended reference template used in sensing a position of a moving object;

FIG. 5B is a schematic elevation diagram illustrating the backlit extended reference template of FIG. 5A with an object at one side of the template;

FIG. 5C is a schematic elevation diagram illustrating the backlit extended reference template of FIG. 5A with an object in front of and part way along the template;

FIG. 6A is a schematic plan view of a bifurcated light guide;

FIG. 6B is a schematic elevation view of the bifurcated light guide of FIG. 6A;

FIG. 7A is a pictorial view which shows a long edge of a media item being transported;

FIG. 7B is a pictorial view which shows a magnified view of an edge area of FIG. 7A;

FIG. 7C is a graph showing pixel intensity versus pixel number for a scan line shown in FIG. 7B;

FIG. 7D is a graph showing pixel intensity versus pixel number for another scan line in FIG. 7B;

DETAILED DESCRIPTION

Figure 1:
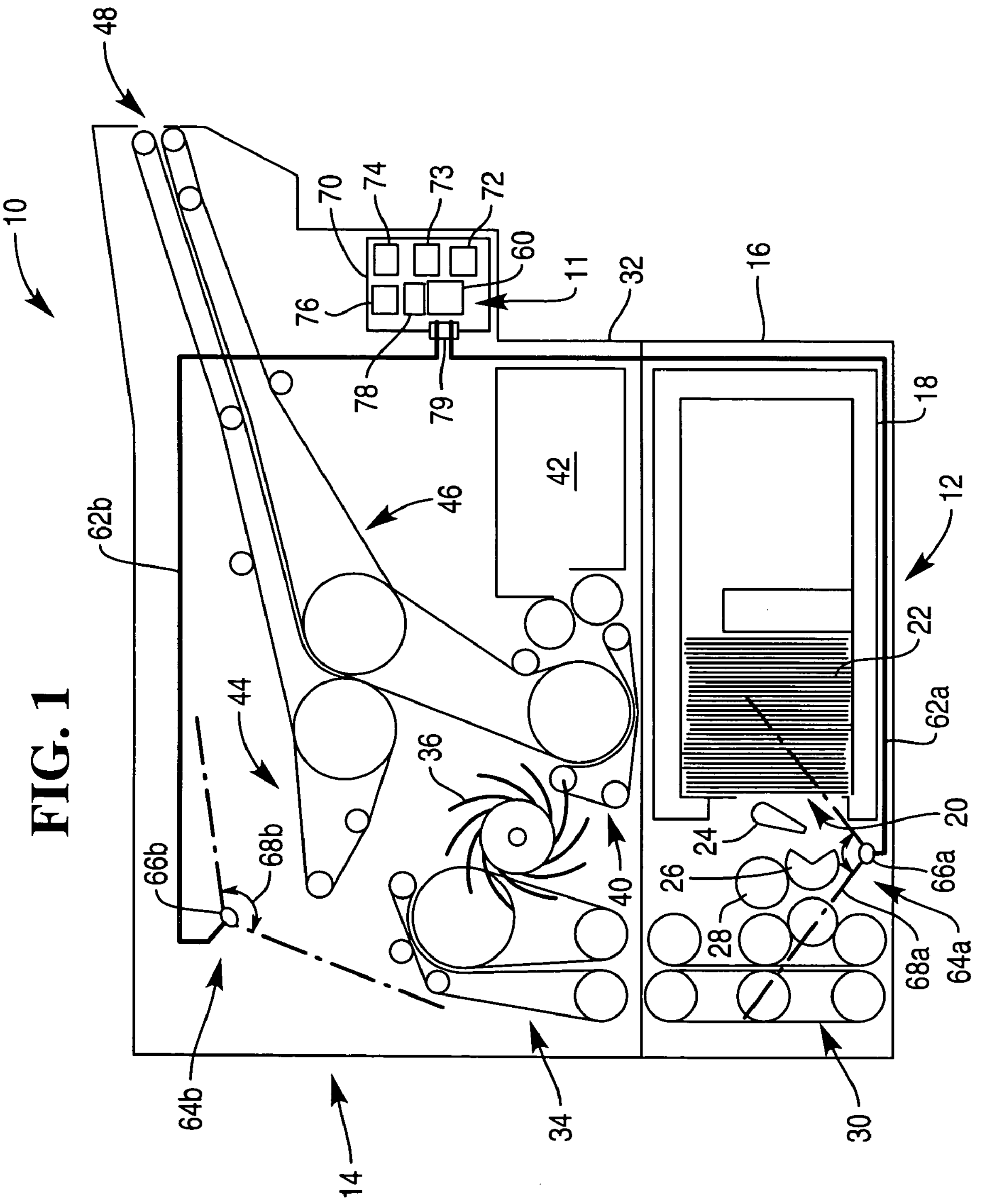
FIG. 1 is a simplified schematic side view of a media dispenser according to one embodiment of the present invention, with parts of the dispenser omitted for clarity.

Reference is first made to FIG. 1, which is a schematic side view of a media handler 10 in the form of a front access currency dispenser, including a sensing arrangement 11 according to one embodiment of the present invention.

The currency dispenser 10 comprises a pick module 12 mounted beneath a presenter module 14. The pick module 12 has a chassis 16 into which a currency cassette 18 is racked. When in situ, the chassis 16 and cassette 18 co-operate to present an aperture (defined by a frame 20) in the cassette 18 through which banknotes 22 are picked.

The pick module 12 includes: (i) a pick arm 24 for removing individual banknotes 22 from the cassette 18; and (ii) a pick wheel 26 and a pressure wheel 28 that co-operate to transfer a picked banknote 22 from the pick arm 24 to a vertical transport 30. As is known in the art, a vertical transport 30 may comprise rollers, stretchable endless belts, and skid plates for transporting a picked media item to the presenter 14.

The presenter module 14 has a chassis 32 releasably coupled to the pick module chassis 16. The presenter module 14 includes a stacking transport 34 that co-operates with the vertical transport 30 to transport a picked banknote 22 to a stacking wheel 36. The presenter module 14 also includes a purge transport 40 to transport a rejected banknote 22 to a purge bin 42.

The presenter module 14 also includes a clamping transport 44 for clamping a bunch of banknotes 22, and a presenting transport 46 for delivering a clamped bunch of banknotes 22 to an exit aperture 48 defined by the chassis 32.

All of the transports described above comprise a combination of rollers and endless belts. The transports may also include one or more skid plates. These transports are all well known in the art, and different transports, such as gear trains, may be used with the present invention.

An imaging device 60, in the form of a CMOS image sensor is mounted within the presenter module 14. In this embodiment, the image sensor 60 is a National Semiconductor (trade mark) LM9630 100×128, 580 fps Ultra Sensitive Monochrome CMOS Image Sensor.

A light guide arrangement 62 comprises two single light guides 62*a,b*. Each light guide 62*a,b* extends from a respective sensing site 64*a,b* within the dispenser 10 to the image sensor 60.

Suitable acrylic plastic light guides are available as custom moldings from: CTP COIL 200 Bath Road, Slough, SL1 4DW, U.K., or from Carclo Technical Plastics, Ploughland House, P.O. Box 14, 62 George Street, Wakefield, WF1 1ZF, U.K. Because each light guide 62 is inflexible, the guide 62 must be designed to a particular shape and configuration that will enable the guide to extend from the image sensor 60 to the sensing site 64. Each light guide 62 is mounted to the dispenser 10 by clips (not shown), thereby enabling a light guide to be snapped into place.

A pick module sensing site 64*a* is located beneath the pick wheel 26. One end of a light guide 62*a* is located at this site 64*a* and includes an integral lens 66*a* for capturing light from a sensing area (indicated by double headed arrow 68*a*) covered by relatively wide viewing angle. In this embodiment, the lens captures light from a viewing angle of approximately 120 degrees. This enables the light guide 62*a* to survey: the aperture 20, the pick wheel 26, and the vertical transport 30, thus providing a complete view of a media transport path throughout the pick module 12.

The light guide 62*a* extends from the pick module sensing site 64*a* to the image sensor 60 to convey optical information in the form of an image thereto, as will be described in more detail below.

A presenter module sensing site 64*b* is located above the stacking transport 34. One end of a light guide 62*b* is located at this site 64*b* and includes an integral lens 66*b* for capturing light from a sensing area (indicated by double headed arrow 68*b*) covered by a relatively wide viewing angle. In this embodiment, the lens 66*b* captures light from a viewing angle of approximately 120 degrees. This enables the light guide 62*b* to survey: the stacking transport 34, the stacking wheel 36, the purge transport 40, the purge bin 42, the clamping transport 44, the presenting transport 46, and the exit aperture 48, thus providing a complete view of a media transport path throughout the presenter module 14.

The light guide 62*b* extends from the presenter module sensing site 64*b* to the image sensor 60 to convey optical information in the form of an image thereto, as will be described in more detail below.

The image sensor 60 is mounted on a control board 70 comprising: a processor 72 and associated RAM 73 for receiving and temporarily storing the output of the sensor 60; non-volatile memory 74, in the form of NVRAM for storing instructions for use by the processor 72 (the non-volatile memory 74 and instructions are collectively referred to herein as firmware); a communications facility 76, in the form of a USB port; and a light guide light source 78 in the form of a white light LED. The light source 78 provides central illumination for the dispenser 10.

The control board 70 includes a mount 79 upstanding from the board 70 for retaining the light guides 62 in a fixed position relative to the image sensor 60.

The processor 72 is in communication with the other components on the control board 70. The primary functions of the processor 72 are (i) to control operation of the dispenser module 10 by activating and de-activating motors (not shown), and such like; and (ii) to capture and analyze the data collected by the image sensor 60. Function (i) is well known to those of skill in the art, and will not be described in detail herein. Function (ii) is described in more detail below, after the light guide arrangement 62 is described.

Reference is now made to FIGS. 2A to 2D to explain the function of the light guide arrangement 62.

FIG. 2A is a perspective view from one side of a light guide 62*a*; FIG. 2B is a perspective view of the light guide 62*a* from the same side, but with the light guide 62*a* flipped over to show the underside thereof; FIG. 2C is an end view of the light guide 62*a* viewed in the direction of arrow C in FIG. 2A, also showing light guide 62*b* in ghost line; and FIG. 2D is a schematic view of the light guide 62*a* illustrating how light is coupled into and out of the guide 62*a*.

Each light guide 62 is a one-piece molding from acrylic plastic and includes: a lens portion 66 formed at one end of the guide 62; a full width trunk portion 82; and a half width branch portion 84 extending from the trunk portion 82 to the image sensor 60.

The branch portion 84 functions as a continuation of the trunk portion 82, although narrower in width, and they share a common sidewall 86.

At an illumination end 88 of the trunk portion 82 opposite the lens portion 66 there is a light input coupling 90 extending approximately half-way across the trunk portion width; the remaining width of the trunk portion 82 continues as the branch portion 84.

The trunk portion 82 is a light guiding portion having a generally cuboid shape. The trunk portion 82 has a width (indicated by arrow 92) of approximately 10 mm and a height of approximately 10 mm. The branch portion 84 is also a light guiding portion having a generally cuboid shape with a width (indicated by arrow 94) of approximately 5 mm and a height of approximately 10 mm.

The light input coupling 90 includes a lens 96 formed on an underside 98 (see FIG. 2B) of the trunk portion 82. The coupling 90 also includes a sloping topside 100 for reflecting light from the light source 78 along the trunk portion 82 to the lens 66.

The branch portion 84 has an imager end 110 in the vicinity of the image sensor 60, which includes a light output coupling 112. The light output coupling 112 is similar to the light input coupling 90, and includes a lens 114 formed on an underside 116 (see FIG. 2B) of the branch portion 84. The coupling 112 also includes a sloping topside 118 for reflecting light propagating from the lens 66 to the image sensor 60.

Light guide 62*b* is the mirror image of light guide 62*a*, which enables the two light guides 62*a,b* to be placed alongside each other, as shown in FIG. 2C. Thus, light guide 62*b* includes a light input coupling 190 having a sloping topside 200 corresponding to the light input coupling 90 having a sloping topside 100 of light guide 62*a*; and light guide 62*b* includes a light output coupling 212 having a sloping topside 218 corresponding to the light output coupling 112 having a sloping topside 118 of light guide 62*a*. When light guides 62*a* and 62*b* are placed beside each other, the two light output couplings 112,212 are adjacent each other and are mounted above different portions of the image sensor 60.

Light output coupling 112 is mounted above portion 60*a* of image sensor 60, referred to as zone A; and light output coupling 212 is mounted above portion 60*b* of image sensor 60, referred to as zone B. Thus, zone A 60*a* is used to detect the light output from light guide 62*a*, and zone B is used to detect the light output from light guide 62*b*.

FIG. 2D illustrates how a light guide 62 functions by referring to light guide 62*a*, although the skilled person will realize that light guide 62*b* functions in a very similar way.

Emitted light (illustrated by unbroken line 130) from light source 78 is coupled into the trunk portion 82 and propagates along the light guide 62*a* and out through the lens 66 to illuminate a sensing area (indicated by arrow 68).

Reflected light (illustrated by broken line 134) from the sensing area 68 is coupled into the trunk portion 82 via the lens 66, and propagates along the trunk portion 82 and the branch portion 84, and out through the light output coupling 112 to illuminate the image sensor zone A 60*a*.

In this embodiment, zone A 60*a* comprises half of the pixels in the image sensor 60 and zone B 60*b* comprises the other half of the pixels in the image sensor 60.

Reference is now made to FIGS. 3A and 3B. FIG. 3A is a graph illustrating light intensity detected across a row of pixels of image sensor 60 at a moment in time. The x-axis represents the pixel number, and the y-axis represents the detected light intensity at a pixel number. Line 300 indicates the threshold intensity between a white and a black point. If the light intensity detected by a pixel is on or above this threshold 300, then that pixel registers a "white" point; whereas, if the light intensity detected by a pixel is below this threshold, then that pixel registers a "black" point.

FIG. 3B is a schematic diagram illustrating the light output status of the row of pixels shown in FIG. 3A. In FIG. 3B three areas 310,312,314 are dark because the light intensity detected by pixels in these areas is below the threshold 300, and two areas 316,318 are light because the light intensity detected by pixels in these areas is above the threshold 300.

It will be appreciated that the image sensor 60 includes a hundred rows of pixels, with a hundred and twenty eight pixels in a row, so a complex scene can be imaged.

There are a number of different techniques that may be used to analyze data recorded by the pixels. This analysis may be for the purpose of determining the position of a moving object and/or to measure properties of an object.

Three main categories of data analysis are described herein: single threshold analysis; multiple threshold analysis (which is particularly useful for sequential image analysis); and distance measurement analysis.

Single Threshold Analysis

A simple example of single threshold analysis has already been described with reference to FIGS. 3A and 3B. However, single threshold analysis may also be used in more complex examples, as illustrated in FIGS. 4A to 4C.

FIG. 4A is a schematic plan diagram illustrating a fixed reference template 330 backlit by a sensing site light source 332 (in the form of a white light LED). A light guide 62 is located to gather optical information from the reference template 330 via the lens 66. An object 334 to be sensed having a marker portion 336 moves parallel with and relative to the fixed reference template 330, and passes between the reference template 330 and the light guide 62 in the direction of double-headed arrow 338. The marker portion 336 is used in sensing the position of the object 334.

FIG. 4B is a schematic elevation view of the reference template 330. The template 330 is a black plastic sheet defining a rectangular aperture having a width of ten millimeters and a height of twenty millimeters. The marker portion 336 has a width of four millimeters and a height of twelve millimeters. The absolute dimensions of the aperture and the marker portion are not essential; however, it is important that the width of the marker portion 336 is less than the width of the rectangular aperture.

The sensing site light source 332 (which is not the same as the light guide light source 78 in FIG. 1) is relatively intense so that the light transmitted through the template aperture is much more intense than any ambient light. This ensures that the reference template 330 (except the aperture) looks black and the aperture looks white. A scan line 340 is shown to illustrate a line that the image sensor 60 will evaluate to determine if the marker 336 is present.

FIG. 4C is a schematic elevation view of the reference template 330 with the marker portion 336 located in front of the aperture. Because the marker portion 336 has low transmissivity and is considerably narrower than the template aperture, the marker portion 336 is partially silhouetted by the rear light source 332, as shown in FIG. 4C. To state this another way, when the marker portion 336 is located in the centre of the aperture, the marker portion 336 appears to be black and surrounded by white light beyond the marker portion's opposing long edges.

The image sensor 60 uses single threshold analysis to determine whether each pixel in a row corresponding to scan line 340 records high intensity (white light) or low intensity (black). If a sequence of consecutive low intensity pixels is bounded on each side by a relatively small number of high intensity pixels, then this indicates that the marker 336 is located entirely within the aperture, as shown in FIG. 4C. Thus, the position of the object 334 can be accurately determined by single threshold analysis using the reference template 330 and the marker portion 336.

It will be apparent to the skilled person that different shapes of reference template aperture may be used (for example, a square, a triangle, a circle, a rhombus, or such like) to detect different shapes of marker portion. If the object may skew when it moves, then a marker portion shape and reference template aperture shape may be selected to enable the amount of skew to be detected. This may involve multiple scan lines being measured.

It should be appreciated that a reference template may include multiple apertures, each aperture may be a different shape, or may be the same shape to track an object as it moves along a path.

It should also be appreciated that the integration time (shutter time) of the image sensor 60 should be selected so that any features in the background produce a light intensity substantially less than the threshold between high intensity and low intensity. Furthermore, the light source 332 should irradiate at an intensity that is substantially above the threshold between high and low intensity. It is preferred that the microprocessor 72 controls the intensity of the light source 332 and the integration time of the image sensor 60 to ensure that the ambient light is detected as very low intensity and the light radiating through the aperture is detected as very high intensity.

Use of a marker portion within the dispenser 10 may be appropriate for a moving mechanical object, such as a lever, a shutter, a shuttle, a door, or such like. The moving mechanical object is aligned when a high intensity signal is recorded on both sides of a low intensity signal.

When a reference template is located at a home position of a mechanism, and the expected direction of movement of the mechanism is known, then only a relatively small number of pixels need to be read and analyzed to determine if there is a transition from high intensity to low intensity and then back to high intensity. This indicates if the mechanism is at the home position. This emulates an optical switch.

A more complex reference image will now be described with reference to FIGS. 5A to 5C. FIG. 5A is a schematic plan diagram illustrating a backlit extended reference template with an object present. In a similar way to FIG. 4A, the extended reference template 350 is positioned between a sensing site light source 352 and a light guide 62. A moving object 354 having a marker portion 356 moves parallel with and relative to the extended reference template 350, and passes between the template 350 and the light guide 62 in the direction of double-headed arrow 358. The marker portion 356 is used by the sensor in determining the position, direction, and speed of the moving object 354.

FIG. 5B is a schematic elevation view of the extended reference template 350. The template 350 is a black plastic sheet defining a rectangular aperture having a width of fifty millimeters and a height of twenty millimeters. The marker portion 356 has a width of four millimeters and a height of twelve millimeters. A scan line 360 is shown to illustrate a line that the image sensor 60 will evaluate to determine if the marker 356 is present. Any convenient line (represented by a row of pixels in the image sensor 60) can be chosen, provided the line passes through the width of the marker portion 356.

FIG. 5C is a schematic elevation view of the extended reference template 350 with the marker portion 356 located in front of the aperture. Because the marker portion 356 has low transmissivity and is considerably narrower than the aperture width, the marker portion 356 is partially silhouetted by the rear light source 352, as shown in FIG. 5C. However, because the aperture is substantially wider than the marker portion 356, single threshold analysis can be used to determine the number of high intensity pixels on one side of the marker 356 (indicated by arrow 362), and the number of high intensity pixels on the opposite side of the marker 356 (indicated by arrow 364). As the object moves from left to right on FIG. 5C, the number of high intensity pixels to the left of the marker portion 356 increases, and the number of high intensity pixels to the right of the marker portion 356 decreases. By counting the number of high intensity pixels on each side of the marker portion, and the rate of change of these numbers, the position, speed, and direction of the moving object can be accurately determined. This extended reference image arrangement described in FIGS. 5A to 5C can therefore be used to emulate an optical encoder.

Multiple Threshold Analysis

In the above examples, only a single threshold is used, that is, every pixel is either high intensity or low intensity; however, in other applications (such as media thickness detection), multiple thresholds may be desirable.

In media thickness detection, the edge of a picked media item is illuminated and the thickness of the media item is measured to validate whether the picked media item really is only a single sheet or if multiple sheets have been inadvertently picked as a single sheet.

To obtain an accurate measurement multiple threshold analysis may be used.

If this was to be implemented in the dispenser 10, then a bifurcated light guide 62*c* would be provided, as shown in FIGS. 6A and 6B, at a suitable sensing site. One suitable sensing site is in proximity to the pick arm 24 (FIG. 1); another suitable site is above the stacking transport 34 (FIG. 1). A sensing site in proximity to the pick arm 24 is preferred because a picked media item pivots about its long edge when it is picked and moved to the vertical transport 30 (as illustrated in FIG. 6B by the media item 370 in full and ghost lines). Pivoting of the media item provides visual access to an upper and lower side of the picked media item.

In FIG. 6A, which is a plan view of the bifurcated light guide 62*c*, and FIG. 6B, which is an elevation view of the bifurcated light guide 62*c*, a media item 370 (or -what is assumed to be an item) is moving in the direction of arrow 372 (FIG. 6B). The upper fork 374 surveys a first edge area 376, and the lower fork 378 surveys a second edge area 380.

The first and second edge areas 376,380 each cover a relatively small area (for example a five millimeter by five millimeter vertical plane) through which the picked media item 370 is transported. The forks 374,378 view their respective areas 376,380 at a slightly different angle, as best seen in FIG. 6B. Furthermore, fork 374 views an upper portion of the media item 370; and fork 378 views a lower portion of the media item 370.

Because measuring thin media items requires a high resolution, the same pixels on an image sensor (such as image sensor 60 in FIG. 1) may be used to record an image from each fork 374,378. Viewing the picked media item 370 from each of two angles (preferably, one including the upper portion of the media item and one including the lower portion of the media item), gives greater confidence that one media item is not being obscured by another.

Each edge area 376,380 is illuminated by an edge illumination light source (not shown). Those parts of the edge areas 376,380 that include an edge of a media item are much brighter than those parts that do not have an edge of a media item. The edge illumination light sources are sequentially illuminated so that only one edge area is illuminated at a time. This ensures that the image sensor (not shown) captures image data from only one edge area at a time, with alternate images emanating from the same edge area.

Reference is now made to FIGS. 7A and 7B, which are grayscale pictorial views of multiple sheets of media 382 being transported as a single media item. FIG. 7A shows a long edge of the media, and includes an edge area illustrated by ellipse 384; FIG. 7B shows a magnified view of the edge area of FIG. 7A, and indicates two scan lines 386*a,b* corresponding to two columns of pixels in an image sensor, such as image sensor 60. The light levels and the image sensor integration time are selected so that most of the image appears dark apart from edges of the media items 382; however, a human observer would be able to see clearly the entire media item(s) 382 due to the ambient light level.

FIG. 7C is a graph showing pixel intensity versus pixel number for scan line 386*a*, and FIG. 7D is a graph showing pixel intensity versus pixel number for scan line 386*b* shown in FIG. 7B. Both of these graphs are based on multiple threshold analysis. The first threshold is set at approximately 90% of the maximum light level; the second threshold is set at approximately 70% of the maximum light level. The 70% level corresponds to strong light emitted from approximately 5 mm behind the media item edge, which provides a 5 mm depth of field. This means that any media item located adjacent another media item and having an edge less than 5 mm behind the edge of that other media item will be detected at the second threshold level.

From FIG. 7C it is clear that there is a first line 382*a* that is substantially thicker than a second line 382*b*. However, it is not possible to be certain that this thicker line 382*a* corresponds to two media items, and not, for example, a fold at an end of one media item.

From FIG. 7D, however, it is clear from the shape of the graph (three clearly resolved peaks, the first two being close together) that the first line 382*a* represents two media items.

In the example of FIG. 7B, both scan lines 386*a,b* cover an image conveyed from a single light guide, or a single fork of a bifurcated light guide; however, images from different forks of a light guide may be required to be confident that two media items are present, that is, to be able to resolve two separate peaks rather than one broad peak. It will also be understood that multiple thresholds may be used (many more than two) to determine if multiple media items are present.

Additional media items may be present outside the focal depth of the sensor (in this example, more than 5 mm behind the leading edge), but these media items may be detected at other positions in the dispenser 10, such as the stacking wheel 36 (FIG. 1).

Distance Measurement Analysis

Figure 8:
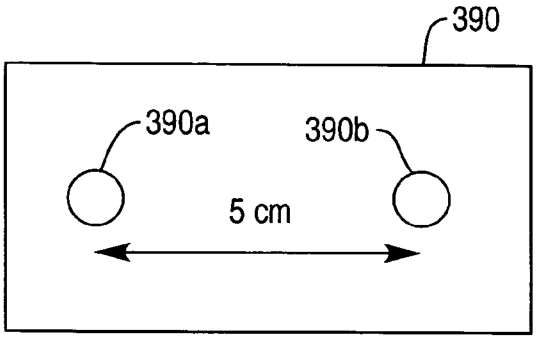
FIG. 8 is a pictorial view of an object having two markings spaced a pre-determined distance apart.

Reference is now made to FIG. 8, which illustrates an object 390 having two markings 392*a,b* in the form of dark dots spaced a predetermined known distance apart, in this example 5 cm. The object 390 has a reflective surface on which the dots 392 are placed.

By applying two dark dots (or any other markings) to a reflective object, where the dots are separated by a known distance, it is possible to compute the distance from the sensor 60 to the object by measuring the apparent distance between the dots. For example, if the apparent separation between the dots is 4.3 cm, then the distance between the dots and the sensor 60 is approximately 15 cm; if the apparent separation between the dots is 2 cm, then the distance between the dots and the sensor 60 is approximately 30 cm. The apparent distance between the dots can be measured using single threshold analysis, and counting the number of high intensity pixels between the two low intensity dots. A mapping of pixels to distance can easily be prepared.

Reference is now made to FIGS. 1 to 3 to describe the operation of the currency dispenser module 10.

In use, light guide 62*a* illuminates the pick module 12 and conveys reflected light back to zone A 60*a* of the image sensor 60. The processor 72 continually analyses the zone A pixels 60*a* to determine the alignment of the pick arm 24 and the location of any picked notes within the module 12. The processor firmware is pre-programmed so that the processor 72 can determine which pixels are related to which object to be detected. Thus, the firmware contains a mapping of the objects to be detected with the pixels in the image sensor 60. For example, the pick arm 24 may be associated with pixels in rows one to twelve and columns one to twenty. By analyzing the pixels in rows one to twelve and columns one to twenty, the processor 72 can determine the position of the pick arm 24.

Light guide 62*b* illuminates the presenter module 14 and conveys reflected light back to zone B 60*b* of the image sensor 60. The processor 72 continually analyses the zone B pixels 60*b* to determine the alignment of the moving parts within the module, for example, the stacking transport 34, the stacking wheel 36, the purge transport 40, the clamping transport 44, and the location of any picked notes within the module 14. Each moving part has a unique group of pixels permanently associated therewith, so the processor 72 analyses a particular group of pixels to determine the location of a particular moving part associated with that group of pixels.

If a processor 72 determines that a picked banknote is skewing as it is moving up the vertical transport 30, then the processor 72 can monitor the banknote as it enters the stacking transport 34 to determine if the skew is increasing or reducing as it is transported. If the skew is increasing, then the processor 72 activates motors (not shown) within the presenter module 14 to purge the skewed banknote to the purge bin 42.

In this embodiment, the light guide 62*b* serves as a note thickness sensor. This is achieved by the image sensor 60 recording an image of the thickness of a picked banknote as it is being transported up the stacking transport 34. The processor 72 analyses this image to determine the thickness of the banknote and to compare the measured thickness with the nominal thickness of a banknote. If the measured thickness exceeds the nominal thickness by more than a predetermined amount (for example, five percent), then the processor 72 either activates the presenter module 14 to purge the measured banknote to the purge bin 42, or continues transporting the picked note if the processor 72 can determine how many notes are present.

In this embodiment, the light guide 62*b* also serves as a bunch thickness sensor. This is achieved by the image sensor 60 recording an image of the thickness of a bunch of banknotes as they are presented to a user at the exit aperture 48. The processor 72 analyses this image to determine the thickness of the bunch before it is presented, and after it is retracted (if it is not removed by the user). If the thickness of the bunch before presentation differs from the thickness of the bunch after retraction by more than a predetermined amount (for example, two percent), then the processor 72 activates the presenter module 14 to purge the measured banknote to the purge bin 42 and records that the retracted bunch contained fewer notes than the presented bunch. The processor 72 may record how many fewer notes were retracted than presented.

Figure 9:
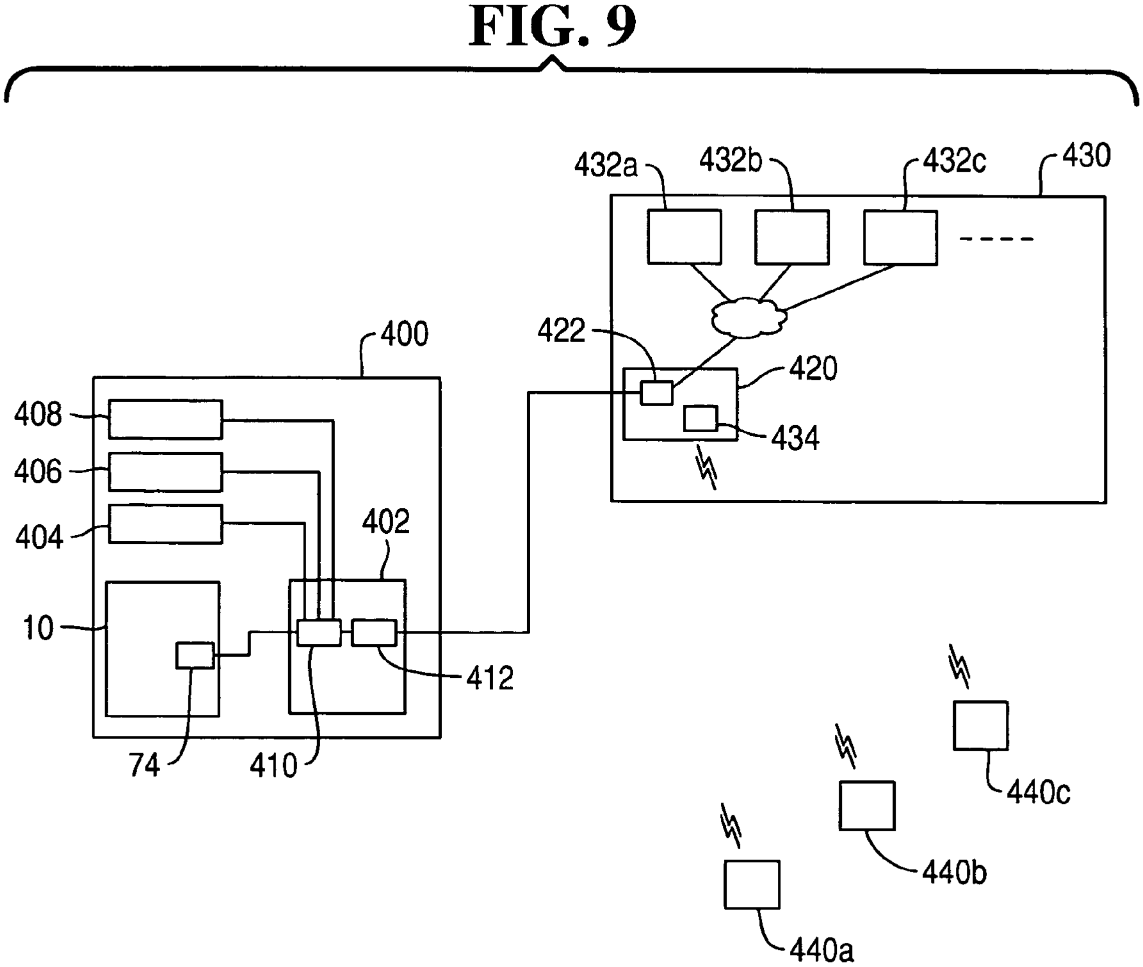
FIG. 9 is a simplified block diagram illustrating a system incorporating the media dispenser of FIG. 1.

Reference is now made to FIG. 9, which is a simplified block diagram illustrating an ATM 400 including the dispenser 10.

The ATM 400 includes a PC core 402, which controls the operation of peripherals within the ATM 400, such as the dispenser 10, a display 404, a card reader 406, an encrypting keypad 408, and such like. The PC core 402 includes a USB port 410 for communicating with the USB port 76 in the dispenser 10.

The PC core 402 includes an Ethernet card 412 for communicating across a network to a remote server 420. The server 420 has an Ethernet card 422 and is located within a diagnostic centre 430. The server 420 receives captured image data from ATMs, such as ATM 400. The image data can be collated and displayed as a sequence of images.

The diagnostic centre 430 includes a plurality of terminals 432 interconnected to the server 420 for monitoring the operation of a large number of such ATMs. The server 420 includes a wireless communication card 434 for communicating with wireless portable field engineer devices 440. These devices 440 are similar to portable digital assistants (PDAs).

In this embodiment, the server 420 is a Web server allowing password protected access to authorized personnel, such as field engineers issued with the field engineer devices 440, and human agents operating the terminals 432.

Referring to both FIG. 1 and FIG. 9, the USB port 76 on the control board 70 transmits image data (in the form of eight bit digital outputs) from the sensor 60 to the PC core 402 located in ATM 400. The PC core 402 transmits the received image data to the Web server 420, thereby enabling operators at the terminals 432 and field engineers to view the captured data by accessing the Web server 420.

The Web server 420 may further process the captured images. Such further processing may include analyzing the captured images to determine patterns emerging prior to a failure arising in the dispenser. This information may be used to predict and avoid similar failures in the future. Field engineers and terminal operators may access these captured images to determine if the dispenser 10 is operating correctly.

It will now be appreciated that the above embodiment has the advantage that an optical image sensor can be used to replace a large number of individual sensors, and can provide more detailed information than was previously available using individual sensors.

Various modifications may be made to the above described embodiment within the scope of the present invention. For example, a two-high currency dispenser was described above; in other embodiments, a one-high, three-high, or four-high dispenser may be used.

In the above embodiment, the media items were currency items; whereas, in other embodiments financial documents, such as checks, Giros, invoices, and such like may be handled.

In other embodiments, media items other than currency or financial documents may be dispensed, for example a booklet of stamps, a telephone card, a magnetic stripe card, an integrated circuit or hybrid card, or such like.

In other embodiments, a dispenser may have one or more cassettes containing currency, and one or more cassettes storing another type of media item capable of being removed by a pick unit.

In other embodiments, the imaging device may be located on a control board, in the pick module, or in some other convenient location.

In other embodiments, the lens portion may be separate from but coupled to the light guide.

In other embodiments, other known types of image processing may be used to analyze images captured by the image sensor.

In the above embodiment, each moving part has a unique group of pixels permanently associated therewith; however, in other embodiments, this may not be the case.

In other embodiments that use a reference template, any convenient template color or material (cardboard, plastic, or such like) may be used. Similarly, the light source used to backlight the reference template may be of any convenient wavelength, although visible wavelengths are preferred as this enables a person to view the measurements, if desired. In dispenser embodiments, each pick module may use two backlight sources, and the presenter module may use five backlight sources; although the number of backlight sources used will vary depending on the number and types of objects to be detected.

What is claimed is:

1. An apparatus, comprising:

a) an Automated Teller Machine, ATM;

b) an image sensor (60) which comprises an array of pixels;

c) a currency sheet pick module (12) located at a first sensing site (64*a*) within the ATM, the module (12) comprising pick components which include i) a pick arm (24), ii) a pick wheel (26), and iii) a pressure wheel (28), the pick components functioning collectively to i) pick currency sheets from storage and ii) transport the currency sheets from the first sensing site (64*a*) to a transport (30) at a second sensing site (64*b*) within the ATM;

d) a first elongated light pipe (62*a*) which extends between the image sensor (60) and the first sensing site (64*a*), e) a first objective lens (66*a*) located at the first sensing site (64*a*), which focuses at least partial images of i) one or more pick components, and ii) a currency sheet, if present at the first sensing site (64*a*)

into the first light pipe (62*a*), which pipe (62*a*) transmits the images to the image sensor (60).

2. Apparatus according to claim 1, and further comprising:

f) a currency sheet presenter module (14) located at the second sensing site (64*b*) within the ATM, which module (14) comprises presenter components which include i) a stacking transport (34) which cooperates with the transport (30) to transport a picked banknote (22) to a stacking wheel (36) which stacks banknotes into a stack;

ii) a clamping transport (44) which accepts the stack; and iii) a presenting transport (46) which delivers the stack of banknotes (22) to an exit aperture (48) for retrieval by a customer;

g) a second elongated light pipe (62*b*) which extends between the image sensor (60) and the second sensing site (64*b*), h) a second objective lens (66*b*) located at the second sensing site (64*b*), which focuses at least partial images of i) one or more presenter components, and ii) a currency sheet, if present at the second sensing site (64*b*)

into the second light pipe (62*b*), which pipe (62*a*) transmits the images to the image sensor (60).

3. Apparatus according to claim 2, in which the second elongated light pipe (62*b*) comprises one or more optical fibers.

4. Apparatus according to claim 2, and further comprising a second collecting lens adjacent the second elongated light pipe (62*b*), for focusing light onto the image sensor (60).

5. Apparatus according to claim 1, in which the first objective (66*a*) lens provides a viewing angle of 120 degrees or more of the first sensing site (64*a*).

6. Apparatus according to claim 5, in which the second objective lens (66*b*) provides a viewing angle of 120 degrees or more of the second sensing site (64*b*).

7. Apparatus according to claim 1, in which 1) a first zone of pixels in the image sensor (60) receives images of the first sensing site (64*a*), and 2) a second zone of pixels in the image sensor (60) receives images of the second sensing site (64*b*).

8. Apparatus according to claim 1, and further comprising a system which transmits images captured by the image sensor (60) to a remote location.

9. Apparatus according to claim 1, in which the distance between the image sensor (60) and the first sensing site (64*a*) exceeds 10 centimeters.

10. Apparatus according to claim 1, in which the first elongated light pipe (62*a*) comprises one or more optical fibers.

11. Apparatus according to claim 1, and further comprising a first collecting lens adjacent the first elongated light pipe (62*a*), for focusing light onto the image sensor (60).

12. A method of operating an Automated Teller Machine, ATM, which contains a currency sheet pick module (12) and a presenter module (14), comprising:

a) at a first sensing site (64*a*) within the ATM, capturing first images of
i) at least some components of the pick module, and
ii) a currency sheet, if present at the first sensing site (64*a*)
b) at a second sensing site (64*b*) within the ATM, which is different from the first sensing site (64*a*), capturing second images of
i) at least some components of the presenter module, and
ii) a currency sheet, if present at the second sensing site (64(*b*)
c) delivering captured first images via a first light pipe (62*a*) to an image sensor (60);
d) delivering captured second images via a second light pipe (62*b*) to the image sensor (60); and
e) processing either or both of the images to ascertain whether a component within the images deviates from a predetermined position.

13. Method according to claim 12, and further comprising:
f) transmitting some or all of the images to a remote diagnostic facility.

14. An apparatus, comprising:
a) an Automated Teller Machine, ATM, which contains
i) a pick module (12) which includes
A) a cassette (18) which stores banknotes (22);
B) a pick arm (24) which removes banknotes (22) from the cassette (18); and
C) a pick wheel (26) and pressure wheel (28) which cooperate to transfer a picked banknote (22) from the pick arm (24) to a transport (30);
ii) a presenter module (24) which includes
A) a stacking transport (34) which cooperates with the transport (30) to transport a picked banknote (22) to a stacking wheel (36) which stacks banknotes into a stack;
B) a clamping transport (44) which accepts the stack;
C) a presenting transport (46) which delivers the stack of banknotes (22) to an exit aperture (48) for retrieval by a customer; and
D) a purge transport (40) which transports a rejected banknote (22) to a purge bin (42);
b) within the ATM,
i) an image sensor (60) which comprises an array of pixels;
ii) a first objective lens (66*a*) which receives an image of
A) part or all of the pick arm (24);
B) part or all of the cassette (18);
C) part or all of the pick wheel (26);
D) part or all of the pressure wheel (28);
E) part or all of the transport (30); and
F) part or all of a banknote (22) if present;
iii) a first elongated light pipe (62*a*) which receives an image focused by the first objective lens (66*a*) and transmits the image to the image sensor (60);
iv) a second objective lens (66*b*) which receives an image of
A) part or all of the a stacking transport (34);
B) part or all of the stacking wheel (36);
C) part or all of the clamping transport (44);
D) part or all of the presenting transport (46); and
E) part or all of a banknote if present;
v) a second elongated light pipe (62*b*) which receives an image focused by the second objective lens (66*b*) and transmits the image to the image sensor (60).

15. Apparatus according to claim 14, and further comprising:
c) a reference template (330) within the ATM which is adjacent to
A) the pick arm (24); or
B) the cassette (18); or
C) the pick wheel (26); or
D) the pressure wheel (28); or
E) the transport (30); or
F) a combination of (A) through (E)
d) an imaging system which uses the first objective lens (66*a*) to capture an image of the reference template (330) when the first objective lens (66*a*) also captures an image of
A) part or all of the pick arm (24);
B) part or all of the cassette (18);
C) part or all of the pick wheel (26);
D) part or all of the pressure wheel (28); and
E) part or all of the transport (30);
e) a processing system which processes the image of paragraph (d) and ascertains whether
A) the pick arm (24);
B) the cassette (18);
C) the pick wheel (26);
D) the pressure wheel (28); or
E) or the transport (30)
are in a predetermined position when the image was captured and
f) a transmitter which transmits the image of paragraph (d) to a remote diagnostic center.

16. Apparatus according to claim 14, in which the ATM contains
A) no sensors which detect position of the pick arm (24);
B) no sensors which detect position of the cassette (18);
C) no sensors which detect position of the pick wheel (26);
D) no sensors which detect position of the pressure wheel (28); and
E) no sensors which detect position of the transport (30).

17. Method according to claim 14 and further comprising:
c) a system which ascertains whether
A) the pick arm (24);
B) the cassette (18);
C) the pick wheel (26);
D) the pressure wheel (28); or
E) or the transport (30)
are in a predetermined respective position when the image was captured, and, if not, causes the ATM to take corrective action.

* * * * *